United States Patent
Drummer et al.

(10) Patent No.: US 7,129,173 B2
(45) Date of Patent: Oct. 31, 2006

(54) PROCESS FOR PRODUCING AND REMOVING A MASK LAYER

(75) Inventors: Heike Drummer, Langebrück (DE); Franz Kreupl, München (DE); Annette Sänger, Dresden (DE); Manfred Engelhardt, Feldkirchen-Westerham (DE); Bernhard Sell, Portland, OR (US); Peter Thieme, Dresden (DE)

(73) Assignee: Infineon Technologies AG, Munich (DE)

(*) Notice: Subject to any disclaimer, the term of this patent is extended or adjusted under 35 U.S.C. 154(b) by 190 days.

(21) Appl. No.: 10/649,411

(22) Filed: Aug. 27, 2003

(65) Prior Publication Data

US 2004/0048479 A1    Mar. 11, 2004

Related U.S. Application Data

(63) Continuation of application No. PCT/DE02/00706, filed on Feb. 26, 2002.

(30) Foreign Application Priority Data

Feb. 27, 2001 (DE) ............... 101 09 328

(51) Int. Cl.
*H01L 21/302* (2006.01)
(52) U.S. Cl. .............. 438/692; 438/720; 438/722
(58) Field of Classification Search ........ 438/692, 438/693, 706, 719, 725; 252/79.1, 79.5
See application file for complete search history.

(56) References Cited

U.S. PATENT DOCUMENTS

| | | | |
|---|---|---|---|
| 5,489,548 A * | 2/1996 | Nishioka et al. ............ 438/396 |
| 5,858,870 A | 1/1999 | Zheng et al. |
| 5,922,515 A | 7/1999 | Chiang et al. |
| 6,099,699 A * | 8/2000 | Pan et al. ............. 204/192.16 |
| 6,150,073 A | 11/2000 | Huang |
| 6,165,695 A * | 12/2000 | Yang et al. ................ 430/314 |
| 6,225,237 B1 * | 5/2001 | Vaartstra ..................... 438/778 |
| 6,261,923 B1 * | 7/2001 | Kuo et al. ................... 438/427 |
| 6,316,329 B1 * | 11/2001 | Hirota et al. ............... 438/424 |
| 6,348,395 B1 * | 2/2002 | Clevenger et al. ......... 438/424 |
| 6,350,682 B1 * | 2/2002 | Liao .......................... 438/638 |
| 6,454,956 B1 | 9/2002 | Engelhardt et al. |
| 6,544,885 B1 * | 4/2003 | Nguyen et al. ............. 438/631 |
| 6,696,759 B1 * | 2/2004 | Clevenger et al. ......... 257/758 |
| 2002/0086511 A1 | 7/2002 | Hartner et al. |

(Continued)

FOREIGN PATENT DOCUMENTS

DE    197 33 391 A1    4/1999

(Continued)

*Primary Examiner*—Kin-Chan Chen
(74) *Attorney, Agent, or Firm*—Laurence A. Greenberg; Werner H. Stemer; Ralph E. Locher

(57) ABSTRACT

A semiconductor substrate is provided, on which there is arranged a first layer, a second layer and a third layer. The third layer is, for example, a resist mask that is used to pattern the second layer. The second layer is, for example, a patterned hard mask used to pattern the first layer. Then, the third layer is removed and a fourth layer is deposited. The fourth layer is, for example, an insulator that fills the trenches which have been formed in the first layer. Then, the fourth layer is planarized by a CMP step. The planarization is continued and the second layer, which is, for example, a hard mask, is removed from the first layer together with the fourth layer. The fourth layer remains in place in a trench which is arranged in the first layer.

8 Claims, 3 Drawing Sheets

U.S. PATENT DOCUMENTS

2002/0115253 A1     8/2002    Engelhardt et al.

FOREIGN PATENT DOCUMENTS

| | | |
|---|---|---|
| DE | 199 29 307 C1 | 11/2000 |
| DE | 199 26 501 A1 | 12/2000 |
| EP | 0 820 092 A1 | 1/1998 |
| EP | 1 001 459 A2 | 5/2000 |
| JP | 07-86393 | 3/1995 |
| WO | 00/77841 A1 | 12/2000 |
| WO | 01/95382 A2 | 12/2001 |

* cited by examiner

PROCESS FOR PRODUCING AND REMOVING A MASK LAYER

CROSS-REFERENCE TO RELATED APPLICATION

This application is a continuation of copending International Application No. PCT/DE02/00706, filed Feb. 26, 2002, which designated the United States and was not published in English.

BACKGROUND OF THE INVENTION

Field of the Invention

The present invention relates to a process for producing a mask layer on a semiconductor substrate and then removing the mask layer from the semiconductor substrate.

In the semiconductor industry, the increasing integration density is leading to imposing increasingly higher demands on the patterning of the layers used. This applies both to the shrinking dimensions and to the use of new types of materials and material combinations. When patterning these layers, it is often advantageous or even imperative to use what are known as hard masks, since hard masks have a higher resistance to etching than conventional resist masks. The hard mask itself is patterned using conventional resist technology and is used, for example, for etching a trench. After etching has been performed, in many cases the hard mask has to be removed. The layers beneath the hard mask must not be attacked or changed during removal of the hard mask. Often, a material that differs from the material of the layer in which the trench has been formed is deposited in the trench. For example, if a metal-containing layer is being patterned, in order to form interconnects, by way of example, the trenches arranged between the patterned interconnects are filled with an insulating material.

The prior art has disclosed processes that remove a hard mask with dry-etching processes or wet-chemical etching processes. A significant drawback of these processes is that the layers arranged beneath the hard mask are attacked or modified. This is often the material that is to be patterned using the hard mask.

SUMMARY OF THE INVENTION

It is accordingly an object of the invention to provide a process for producing a mask layer on a semiconductor substrate and then removing the mask layer from the semiconductor substrate, which overcomes the above-mentioned disadvantages of the prior art processes of this general type.

With the foregoing and other objects in view there is provided, in accordance with the invention, a process for producing a mask layer for a semiconductor substrate. The process includes providing a configuration including: a semiconductor substrate, a first layer configuration configured on the semiconductor substrate, a second layer configured on the first layer configuration, and a third layer configured on the second layer. The first layer configuration is a ferroelectric or dielectric layer configuration of a plurality of individual layers including an upper layer having a metal, a middle layer having barium-strontium-titanate or strontium-bismuth-tantalate, and a lower layer having iridium or iridium oxide. The third layer is patterned to form a first trench, which uncovers the second layer, in the third layer. The third layer is used as an etching mask to etch the second layer and form a second trench in the second layer near the first trench. The second trench uncovers the upper layer of the first layer configuration. The third layer is removed from the second layer. The second layer is used as an etching mask to etch all of the plurality of individual layers of the first layer configuration and to form a third trench in all of the plurality of individual layers of the first layer configuration. The third trench is formed near the second trench and uncovers the substrate. After forming the third trench, a fourth layer of an insulating material is deposited on the semiconductor substrate. The fourth layer and then the second layer are chemically-mechanically polished to remove the fourth layer from the second layer and then to remove the second layer from the upper layer of the first layer configuration. The fourth layer remains in place in the third trench.

With the foregoing and other objects in view there is also provided, in accordance with the invention, a process for producing a mask layer for a semiconductor substrate. The process includes providing a configuration including: a semiconductor substrate, a first layer configuration configured on the semiconductor substrate, a second layer configured on the first layer configuration, and a third layer configured on the second layer. The first layer configuration is a magneto-resistive layer configuration of a plurality of individual layers including an upper layer having a metal, a middle layer, and a lower layer having aluminum oxide, aluminum nitride or titanium oxide. The third layer is patterned to form a first trench, which uncovers the second layer, in the third layer. The third layer is used as an etching mask to etch the second layer and form a second trench in the second layer near the first trench. The second trench uncovers the upper layer of the first layer configuration. The third layer is removed from the second layer. The second layer is used as an etching mask to etch all of the plurality of individual layers of the first layer configuration and to form a third trench in all of the plurality of individual layers of the first layer configuration. The third trench is formed near the second trench and uncovers the substrate. After forming the third trench, a fourth layer of an insulating material is deposited on the semiconductor substrate. The fourth layer and then the second layer are chemically-mechanically polished to remove the fourth layer from the second layer and then to remove the second layer from the upper layer of the first layer configuration. The fourth layer remains in place in the third trench.

One advantage of the process resides in the fact that the fourth layer and the second layer are worn away during the chemical mechanical polishing (CMP) that is carried out. This allows an integrated process step that first removes the fourth layer from the second layer and then removes the second layer from the first layer. The second layer and the fourth layer are planarized and removed and the fourth layer remains in place in the third trench that is arranged in the first layer. The second layer is, for example, a hard mask and the fourth layer is, for example, an interlayer that can be arranged between interconnects (intermetal dielectric). The process step, according to the invention, has the advantage that the removal of the hard mask by a CMP is carried out at the same time that the interlayer, which has been introduced into the trenches in the layer that has been patterned using the hard mask, is planarized.

An advantageous process step provides for the first layer to be formed from a polysilicon-containing or metal-containing layer. The first layer is, for example, a layer that will be patterned and from which interconnects can be formed.

A further process step provides for the first layer to be formed from a layer that contains iridium, iridium oxide, tungsten, tantalum, titanium, copper, titanium nitride, tantalum nitride, tungsten silicide, tungsten nitride, platinum, iridium, cobalt, palladium, silicide, nitride or carbide. The abovementioned materials are advantageously suitable for patterning to form interconnects using an etching process.

A further advantageous configuration of the process provides for the second layer to be formed from a layer which contains silicon nitride, silicon oxide, polysilicon, titanium, titanium nitride or tungsten. The materials mentioned are advantageously suitable for use as a hard mask during an etching process.

A further process variant provides for the third layer to be formed as a photosensitive mask layer. The photosensitive mask layer can be patterned, for example, by optical lithography and etching techniques, so that it can be used to pattern the second layer, such as for example, a hard mask.

A further process step provides for the fourth layer to be formed from a layer that contains silicon oxide, silicon nitride, butylcyclobutene or polybutyl oxalate.

A further process variant provides for the chemical mechanical polishing to be carried out using a polishing fluid that has a solids content of between 20% and 40% or that contains ammonia or that has a pH between 9 and 11. A polishing fluid which has one of the abovementioned properties is advantageously suitable for the simultaneous polishing of a hard mask and an interlayer.

Other features which are considered as characteristic for the invention are set forth in the appended claims.

Although the invention is illustrated and described herein as embodied in a process for producing a mask layer on a semiconductor substrate and then removing the mask layer from the semiconductor substrate, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
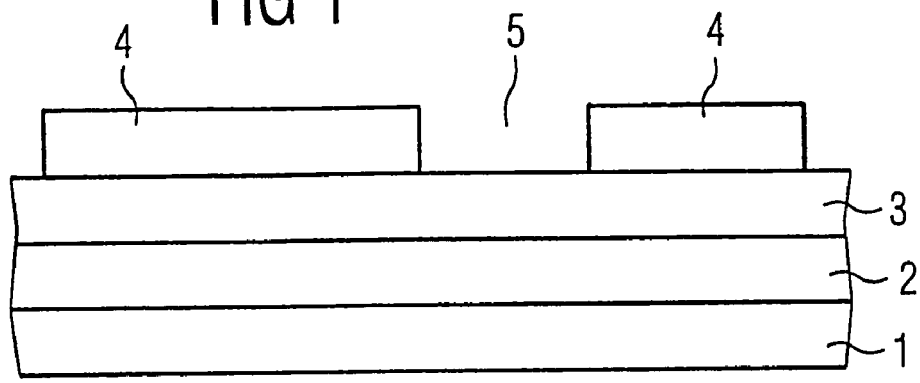
FIG. 1 is cross-sectional view of a layer stack with a patterned resist mask.

Referring now to the figures of the drawing in detail and first, particularly, to FIG. 1 thereof, there is shown a substrate 1 on which a first layer 2 is arranged. A second layer 3 is arranged on the first layer 2. A third layer 4, in which a first trench 5 has been formed, is arranged on the second layer 3. The first layer 2 represents the layer which is to be patterned and contains, for example, one or a combination of the materials iridium oxide, tungsten, tantalum, titanium, copper, titanium nitride, tantalum nitride, tungsten silicide, tungsten nitride, platinum, iridium, cobalt, palladium, metal silicide, metal nitride and carbide. The second layer 3 forms, for example, a hard mask and contains, for example, one or a combination of the materials silicon nitride, silicon oxide, polycrystalline silicon, titanium, titanium nitride and tungsten. The third layer 4 is, for example, a photosensitive resist mask that has been exposed by a photolithographic exposure step and then developed. The first trench 5 has been formed in the third layer 4.

Figure 2:
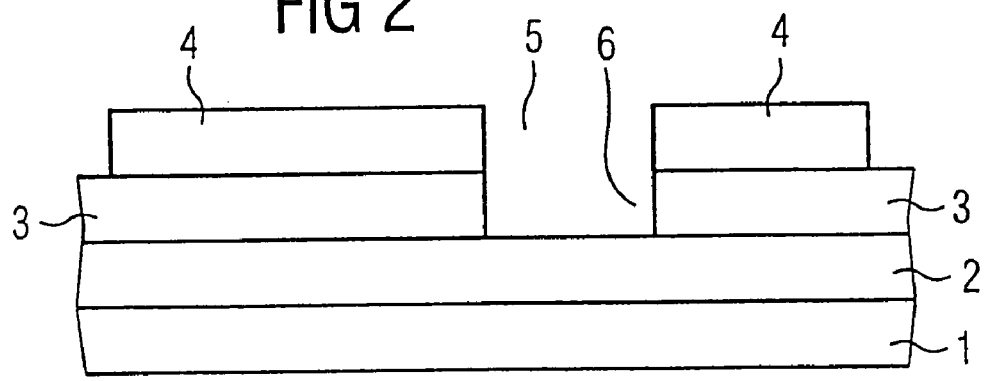
FIG. 2 is cross-sectional view of the layer stack from FIG. 1, after a hard mask has been patterned.

Referring now to FIG. 2, an etching step is carried out, in which the second layer 3 is patterned using the third layer 4. In this step, a second trench 6 is formed in the second layer 3 in the region of the first trench 5 that has been formed in the third layer 4. A surface of the first layer 2 is uncovered in the region of the second trench 6. The second layer 3 is etched selectively with respect to the mask formed by the third layer 4.

Figure 3:
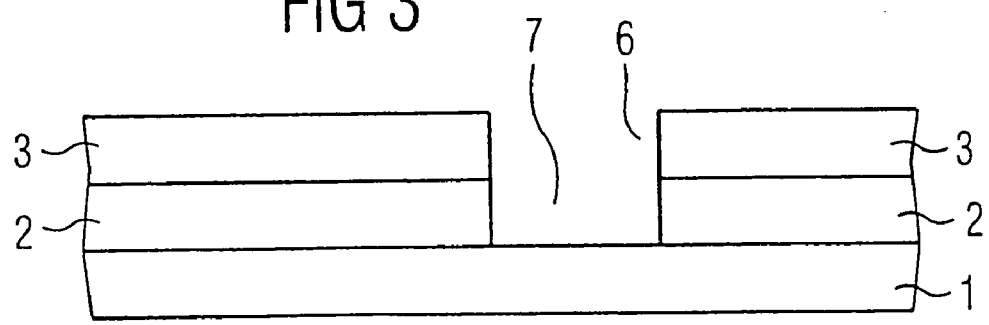
FIG. 3 is cross-sectional view of the layer stack from FIG. 2 after the resist mask has been removed.

Referring to FIG. 3, the resist mask formed by the third layer 4 is then removed. By way of example, solvents which are able to remove a resist mask are suitable for this purpose. This step can usually be carried out very selectively with respect to the other layers arranged on the substrate 1. Then, the first layer 2 is patterned by an etching process, with the second layer 3 being used as an etching mask. The second layer 3 is a hard mask. During the etching process, the trench 6 which has been formed in the layer 3 is deepened into the layer 2, so that a third trench 7 is formed. The etching step forms the third trench 7 in such a way that it at least partially uncovers the substrate 1.

Figure 4:
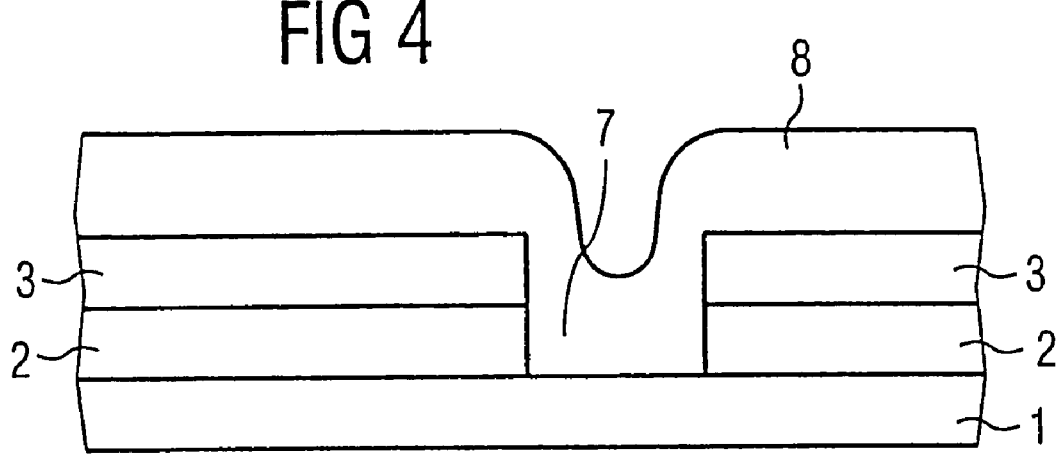
FIG. 4 is cross-sectional view of the layer stack from FIG. 3 after an interlayer has been deposited.

Referring now to FIG. 4, a fourth layer 8 is then deposited on the patterned arrangement. The fourth layer 8 is deposited on the substrate 1 and the second layer 3 and fills the third trench 7. The fourth layer 8 contains, for example, silicon oxide, a doped silicon oxide, silicon nitride, a dielectric with a low dielectric constant of less than 2, butylcyclobutene, or polybutyl oxalate. The materials are advantageously suitable for forming an insulating layer between conductive structures.

Figure 5:
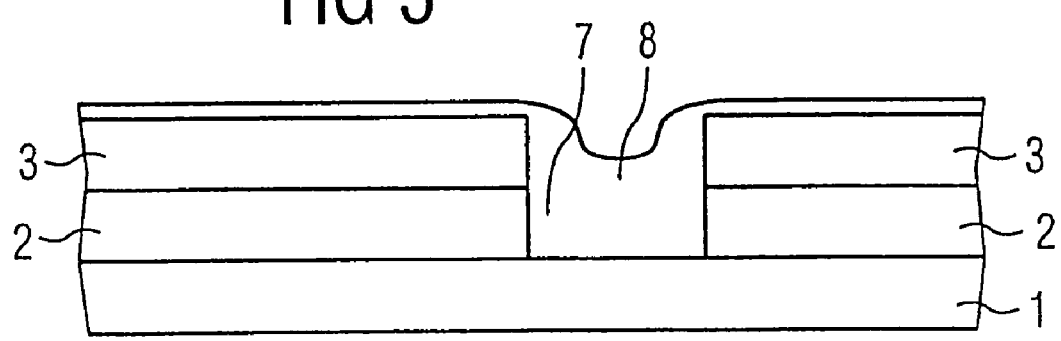
FIG. 5 is cross-sectional view of the arrangement from FIG. 4 which has been partially planarized by a CMP.
Figure 6:
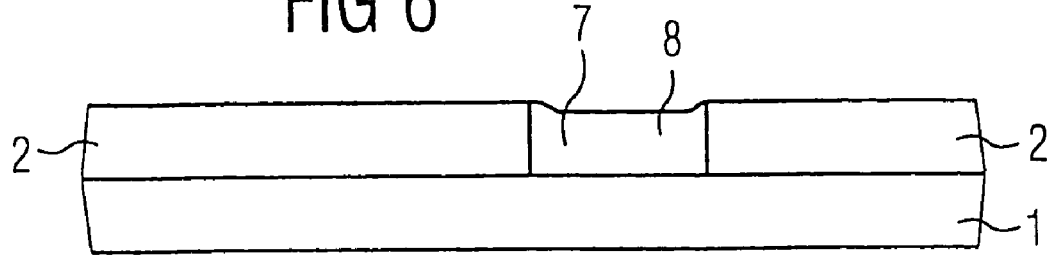
FIG. 6 is cross-sectional view of the arrangement from FIG. 5 after polishing by CMP.

Referring now to FIG. 5, a chemical mechanical polishing (CMP) step is carried out, in which first of all the fourth layer 8 is removed from the second layer 3. The chemical mechanical polishing step is continued until, as illustrated in FIG. 6, the second layer 3 has been removed from the first layer 2 and the part of the fourth layer which remains in place in the third trench 7 has been planarized.

By way of example, the chemical mechanical polishing is carried out using a Westech 472 polishing installation produced by Speedfam-Ipec. The installation is a polishing installation having a grinding wheel and two polishing tables. By way of example, an IC1000 Suba IV produced by Rodel is suitable for use as a polishing cloth on the polishing table. The standard model Rodel T3 is used as a backing film (insulating mechanical support) on the substrate holder. An example of a suitable polishing fluid is Klebosol 30N50 produced by Clariant. Polishing fluids that include silicon oxide particles with a size of between 30 and 500 nm, preferably 100 nm, in a solid percentage content by weight of between 20 and 40% and using ammonia as a stabilizer, with a pH of between 9 and 11, are likewise suitable.

In order to achieve similar removal rates for silicon oxide and silicon nitride, the polishing fluid used is a slurry comprising 30% silicon oxide with a mean grain size of 75 nm and has ammonia as a stabilizer, with a pH of approx. 10.

An example of a suitable rotational speed for the polishing table is 20 to 70 rpm, and 65 rpm is particularly advantageous. The substrate holders can be operated at 20 to 70 rpm, and 62 rpm is particularly advantageous. Values of between 3 and 12 PSI are suitable for the contact pressure of the substrate on the polishing cloth, and 8 PSI is particularly advantageous. Suitable values for the rear side pressure are between 0 and 5 PSI, and 1 PSI is particularly advantageous. The polishing fluid is introduced at a flow rate of 60 to 250 ml/min, and 100 ml/min is particularly advantageous. If the second layer 3 is formed as a hard mask, for example, from silicon nitride, and the fourth layer 8 is formed as an intermetal dielectric, for example, from silicon oxide, the result, with the process parameters described above, is a removal rate of approx. 360 nm/min, which is advantageous.

During the chemical mechanical polishing, it is preferable to select process parameters with a removal rate ratio of 1:1 between the second layer 3 and the fourth layer 8. Removal rate ratios of between 0.9 and 1.1 are also suitable. In this context, it is advantageous if the second layer 3, which forms the hard mask, is removed slightly more quickly than the fourth layer 8. One possible option for detecting that the second layer 3 has been completely removed and the process can be ended is, for example, to monitor the motor current of polishing table or substrate holder or a combination of the two. This results from the fact that the second layer 3 usually has a friction with respect to the polishing cloth which differs from that of the first layer 2. In this case, a change in the motor current can be used as a signal to end the process. It is also advantageous to use a relatively hard and rigid polishing cloth, which promotes the planarization effect. An example of a suitable polishing cloth is a polishing cloth with a Shore D hardness of 50, specified in the range from 35 to 65. The deflection of the polishing cloth should be around 3.8 inches (spec: 0–6) and the compressibility should be around 3.5% (spec: 0–6%).

Furthermore, a product produced by Dow Chemical which is marketed under the trademark SILK is a suitable material for the fourth layer 8. This product is a mixture that contains silicon, silicon oxide and carbon.

Figure 7:
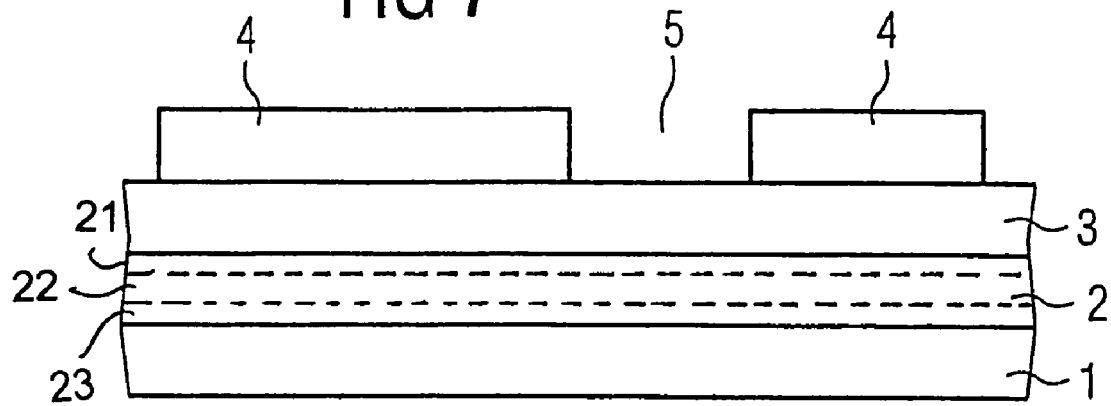
FIG. 7 is cross-sectional view of a layer stack with a patterned resist mask for use with a further preferred exemplary embodiment of the invention.

FIG. 7 illustrates a further exemplary embodiment of the invention which is at a processing state similar to that shown in FIG. 1. FIG. 7 shows a layer stack comprising a substrate 1, a first layer 2, and a second layer 3 forming a hard mask, on which there is a third layer forming a resist mask 4 which has already been patterned. The first layer 2 is composed of a plurality of partial layers 21, 22, 23. By way of example, this may be a layer sequence which is suitable for fabricating a magnetoresistive memory, known as an MRAM (magnetoresistive random access memory), or a ferroelectric memory, known as an FRAM (ferroelectric random access memory), or a semiconductor memory with dynamic memory cells with a capacity of above approximately 1 GBit, known as a GBit-DRAM (dynamic random access memory). Memories of this type are used for the nonvolatile storage of data. It is possible to use particular materials that act as dielectrics or electrode materials. By way of example, barium-strontium-titanate (BST) can be used for FRAM memory cells. Strontium-bismuth-tantalate can be used for GBit-DRAMs. Since oxygen-containing process steps are required to deposit these materials, oxidation-resistant barriers are required to prevent the diffusion of oxygen into layers below. Finally, these dielectrics also require metallic electrode materials. Platinum or iridium can be used as electrode materials for FRAMs. In general terms, iridium or iridium oxide are also suitable barrier materials. Electrode materials such as iron, nickel, copper, chromium, metal oxides, cobalt or multilayer comprising these materials can be used for MRAM memory cells. Aluminum oxide, aluminum nitride or titanium dioxide are suitable as tunneling barriers in MRAM memory cells.

The materials mentioned have the property of being difficult to etch. Therefore, in accordance with the invention, hard masks, for example, consisting of silicon dioxide or silicon nitride, are suitable for patterning these layers.

In the exemplary embodiment shown in FIG. 7, the first layer 2 includes a plurality of partial layers. By way of example, the top partial layer 21 comprises a metal, such as platinum, iridium, cobalt or copper. Beneath that, there is a dielectric layer 22, for example formed from BST. The bottom partial layer 23 of the multilayer stack 2 is the oxidation-resistant barrier formed, for example, from iridium or iridium oxide. In the case of the example of an MRAM memory cell, the metal electrode 21 may be formed from iron, nickel, copper, chromium, metal oxides, cobalt or multilayers of these metals. The tunneling barrier 23 used is aluminum oxide, aluminum nitride or titanium dioxide. The layer 1 below is substrate material, for example, silicon or silicon dioxide.

The layer stack 21, 22, 23 is composed of materials which are difficult to etch, and consequently a hard mask is used for patterning by etching. The hard mask layer 3 is first patterned using the resist mask 4. Then, the layer stack 21, 22, 23 is etched based on the mask formed by the resist mask 4 and the hard mask 3. Then, the resist mask 4 is removed as illustrated in FIGS. 3 to 6. To remove the hard mask 3, the additional fourth layer 8 (see FIG. 4) is applied, and then the fourth layer 8 and the hard mask 3 are removed together by chemical mechanical polishing. After the CMP process step, the surface of the semiconductor wafer presents the surface of the layer stack 2, i.e. the metallic electrode 21, within which the trench formed by etching has been filled with the additionally applied fourth layer 8. The surface is then planarized. The removal of the hard mask layer 3 and the planarization have been carried out simultaneously using the CMP step.

We claim:

1. A process for producing a mask layer for a semiconductor substrate, the process which comprises:
   providing a configuration including a semiconductor substrate, a first layer configuration configured on the semiconductor substrate, a second layer configured on the first layer configuration, and a third layer configured on the second layer, the first layer configuration being a ferroelectric or dielectric layer configuration of a plurality of individual layers including an upper layer having a metal, a middle layer having barium-strontium-titanate, and a lower layer having iridium or iridium oxide;
   patterning the third layer to form a first trench, which uncovers the second layer, in the third layer;
   using the third layer as an etching mask, etching the second layer and forming a second trench in the second layer near the first trench, the second trench uncovering the upper layer of the first layer configuration;
   removing the third layer from the second layer;
   using the second layer as an etching mask, etching all of the plurality of individual layers of the first layer configuration and forming a third trench in all of the plurality of individual layers of the first layer configuration, the third trench being formed near the second trench and uncovering the substrate;

after forming the third trench, depositing a fourth layer of an insulating material on the semiconductor substrate;

chemically-mechanically polishing the fourth layer and then the second layer to remove the fourth layer from the second layer and then to remove the second layer from the upper layer of the first layer configuration, the fourth layer remaining in place in the third trench.

2. The process according to claim 1, wherein the upper layer of the first layer arrangement includes tungsten, tantalum, titanium, copper, titanium nitride, tantalum nitride, tungsten silicide, tungsten nitride, platinum, iridium, cobalt, palladium, silicide, nitride, or carbide.

3. The process according to claim 1, wherein the third layer is a photosensitive mask layer.

4. The process according to claim 1, wherein the fourth layer includes silicon oxide, silicon nitride, butylcyclobutene, or polybutyl oxalate.

5. The process according to claim 1, which further comprises performing the chemically mechanically polishing step using a polishing fluid having a solids content of between 20% and 40%.

6. The process according to claim 1, which further comprises performing the chemically mechanically polishing step using a polishing fluid including ammonia.

7. The process according to claim 1, which further comprises performing the chemically mechanically polishing step using a polishing fluid having a pH between 9 and 11.

8. A process for producing a mask layer for a semiconductor substrate, the process which comprises:

providing a configuration including a semiconductor substrate, a first layer configuration configured on the semiconductor substrate, a second layer configured on the first layer configuration, and a third layer configured on the second layer, the first layer configuration being a ferroelectric or dielectric layer configuration of a plurality of individual layers including an upper layer having a metal, a middle layer having strontium-bismuth-tantalate, and a lower layer having iridium or iridium oxide;

patterning the third layer to form a first trench in the third layer, uncovering the second layer;

using the third layer as an etching mask, etching the second layer and forming a second trench in the second layer near the first trench, the second trench uncovering the upper layer of the first layer configuration;

removing the third layer from the second layer;

using the second layer as an etching mask, etching all of the plurality of individual layers of the first layer configuration and forming a third trench in all of the plurality of individual layers of the first layer configuration, the third trench being formed near the second trench and uncovering the substrate;

after forming the third trench, depositing a fourth layer of an insulating material on the semiconductor substrate;

chemically-mechanically polishing the fourth layer and then the second layer to remove the fourth layer from the second layer and then to remove the second layer from the upper layer of the first layer configuration, the fourth layer remaining in place in the third trench.

* * * * *